(12) United States Patent
Zhu

(10) Patent No.: US 9,452,410 B2
(45) Date of Patent: Sep. 27, 2016

(54) FULLERENE ARC SOURCE AND FULLERENE PRODUCTION APPARATUS COMPRISING THE SAME

(71) Applicant: XIAMEN FUNANO NEW MATERIAL TECHNOLOGY COMPANY.LTD, Xiamen (CN)

(72) Inventor: Changfeng Zhu, Xiamen (CN)

(73) Assignee: XIAMEN FUNANO NEW MATERIAL TECHNOLOGY COMPANY. LTD, Xiamen (CN)

( * ) Notice: Subject to any disclaimer, the term of this patent is extended or adjusted under 35 U.S.C. 154(b) by 0 days.

(21) Appl. No.: 14/784,289

(22) PCT Filed: Jul. 30, 2014

(86) PCT No.: PCT/CN2014/083313
§ 371 (c)(1),
(2) Date: Oct. 14, 2015

(87) PCT Pub. No.: WO2015/070642
PCT Pub. Date: May 21, 2015

(65) Prior Publication Data
US 2016/0059205 A1 Mar. 3, 2016

(30) Foreign Application Priority Data

Nov. 12, 2013 (CN) .......................... 2013 1 0559199
Nov. 12, 2013 (CN) ..................... 2013 2 0710393 U

(51) Int. Cl.
| | |
|---|---|
| *C01B 31/02* | (2006.01) |
| *B01J 19/08* | (2006.01) |
| *H01J 37/32* | (2006.01) |
| *H05H 1/48* | (2006.01) |

(52) U.S. Cl.
CPC .......... *B01J 19/088* (2013.01); *C01B 31/0213* (2013.01); *H01J 37/32055* (2013.01); *H05H 1/48* (2013.01); *B01J 2219/0809* (2013.01); *B01J 2219/0822* (2013.01); *B01J 2219/0839* (2013.01); *B01J 2219/0869* (2013.01); *B01J 2219/0879* (2013.01)

(58) Field of Classification Search
CPC ............ B01J 19/088; B01J 2219/0809; B01J 2219/0822; B01J 2219/0839; B01J 2219/0869; B01J 2219/0879; C01B 3/0213; H01J 37/32055; H05H 1/48
See application file for complete search history.

(56) References Cited

U.S. PATENT DOCUMENTS

| | | | |
|---|---|---|---|
| 5,393,955 A | 2/1995 | Simmons | |
| 5,753,088 A * | 5/1998 | Olk ........................ | B82Y 30/00 204/173 |
| 2004/0262145 A1* | 12/2004 | Duzhev ................. | B01J 19/088 204/164 |
| 2006/0065516 A1 | 3/2006 | Matsuura | |

FOREIGN PATENT DOCUMENTS

| | | |
|---|---|---|
| CN | 100351174 C | 11/2007 |
| CN | 102001645 A | 4/2011 |
| CN | 103585942 A | 2/2014 |
| CN | 203620619 U | 6/2014 |
| CN | 203620620 U | 6/2014 |
| WO | WO2005088067 A1 | 7/2005 |

* cited by examiner

*Primary Examiner* — Kishor Mayekar
(74) *Attorney, Agent, or Firm* — Gokalp Bayramoglu

(57) ABSTRACT

A fullerene arc source and a fullerene production apparatus comprising the arc source. More than one independent arc source (2) is mounted in a vacuum furnace (1). Each arc source (2) comprises an anode (21) and a cathode trigger (23). The anode (21) is in contact with the cathode trigger (23) to generate an arc and a triggering end of a positive electrode is vaporized to produce a mixture comprising the fullerene. The multiple arc source (2) in the vacuum furnace (1) simultaneously work to industrially produce the fullerene in a mass manner.

11 Claims, 3 Drawing Sheets

FULLERENE ARC SOURCE AND FULLERENE PRODUCTION APPARATUS COMPRISING THE SAME

CROSS-REFERENCE TO RELATED APPLICATIONS

The present invention claims the benefit of the two Chinese patent application titled "fullerene effective manufacturing device using arc process" and "fullerene arc source device". The application date of the patent application titled "fullerene effective manufacturing device using arc process" is Nov. 12, 2013 with an application number 201320710393.6. The application date of the patent application titled "fullerene arc source device" is Nov. 12, 2013 with an application number 201320710393.6.

FIELD OF THE INVENTION

The present disclosure discloses a fullerene arc source and fullerene production apparatus comprising the same. According to the international patent classification (IPC), the present disclosure belongs to the field of manufacturing fullerene production device.

BACKGROUND OF THE INVENTION

Fullerene is an allotrope of carbon and graphite. The most common fullerene is hollow fullerene such as C60, C70, and metal fullerene containing other elements. Nowadays, the preparation of the fullerenes remains in the stage of gram level in the laboratory. With the widely application and promotion of fullerene and metal fullerene, laboratory research equipment becomes unable to meet the requirements of the booming needs for fullerene and metal fullerene.

Arc process is the common method to obtain fullerene. The fullerene is obtained through the discharging of the anode and cathode, evaporating of the graphite electrode and a cooling process. The anode and cathode are opposite located in the furnace. The anode and cathode inside the furnace are linearly arranged and are dispersed with each other. Thus, a single arc source formed by an anode and a cathode is installed in a single furnace, resulting a low production efficiency and failing to meet the requirement of industrial production.

Chinese patent Application No. CN201010591761.0 discloses a rotating arc furnace for preparation of fullerene nano material. The anode and cathode of the rotating arc furnace are opposite located, and the cathode rod and the anode rod connected with the anode and the cathode extend along two reverse directions and pass through the right side and left side of the furnace respectively. Chinese patent Application No. CN200510124525.7 discloses an arc furnace has an anode rotary plate which has 1 to 6 anode rod installed on. The arrangement of the anode and the cathode is of the same as the aforementioned patent, thus, lowers the production capacity and efficiency.

BRIEF DESCRIPTION OF THE INVENTION

The present invention overcomes the drawbacks of the existing technology and provides a well-constructed fullerene arc source. By designing a closed electrode circuit, a plurality of the aforementioned independent arc sources can be installed on a same fullerene synthetic furnace and this design becomes the core of fullerene mass production with high-efficiency.

Another aim of the present invention is to provide an aforementioned arc source fullerene production device which can automatically and efficiently produce fullerene and metal fullerene.

The present invention can be achieved through the technical proposal thereafter:

A fullerene arc source, comprising: an anode, a cathode and a cathode trigger. The anode, the cathode and the cathode trigger form a closed current circuit. The cathode trigger is arranged at one end of cathode. When a triggering end of anode contacts with the cathode trigger, an arc is formed to evaporate the triggering end of the anode to form a mixture containing fullerene therein.

Preferable, the anode and the cathode are fixed on a mounting component. the triggering end of the anode is capable of moving forward and backward to maintain a relative position with the cathode trigger.

Preferable, the triggering end of the anode is a graphite rod which is in connection with an anode pushing shaft to achieve moving forward and backward. The anode pushing shaft passes through the mounting component and is controlled by a linear sliding module. The linear sliding module is located on the other side of the installing component relative to the triggering end.

Preferable, the linear sliding module and a servo motor form an automatic pushing system to push the anode pushing shaft. The graphite rod installed on the anode is pushed by the automatic pushing system. The anode pushing shaft is fixed on a sliding block via an anode insulating fixture and connected to the linear sliding module. A part of the anode pushing shaft which is located on the mounting plate and near the graphite rod are installed with an anode protective casing.

Preferable, the cathode trigger of the arc source is graphite sheet, graphite rod. The mounting component securing the anode and the cathode is mounting plate, flange or other components fixed in the vacuum furnace.

Preferable, the cathode trigger is connected with a cathode shaft and the cathode shaft passes through the mounting plate.

Preferable, the anode pushing shaft and cathode shaft include cooling passage and a cooling nozzle therein.

A fullerene production apparatus using arc source, comprises a vacuum furnace and aforementioned fullerene arc source. More than one independent arc source is mounted in the vacuum furnace. The anode of each arc source contacts with the cathode trigger to generate an arc and a triggering end of the anode electrode is vaporized to produce a mixture comprising fullerene. The multiple arc sources in the vacuum furnace can work at the same time to industrially produce fullerene in a mass manner.

Preferable, a plurality of arc sources is installed on each layer of vacuum furnace from top to bottom. Each layer generally comprises at least one arc source and the arc source are located around the vacuum furnace. Each arc source is fixed on the corresponding interface of vacuum furnace through the mounting component. The linear sliding module is located on the outside of the furnace.

Preferable, the vacuum furnace has vacuumized interface installed thereon. The furnace door of the vacuum furnace has observation window. The fixture component between the arc source and the vacuum furnace is mounting plate, flange or other similar elements.

Preferable, bottom exits of the vacuum furnace is connected with an automatic ash collecting tube. The exit of the collecting tube is connected to the next manufacturing process. A magnetic valve controlling switch is installed on automatic ash collecting tube. The ash is automatically pumped out from the vacuum furnace by a high-speed exhaust fan.

The present invention discloses a closed circuit of fullerene arc source which changes the current installing way of arc source. The plurality of arc sources with closed current circuit are fixed on the vacuum furnace through the mounting component such as mounting plate and flange. Resulting an arc discharging phenomenon occurs in a vacuum condition. The amount of arc source device of the present invention can be varied depending on the needs and the size of the furnace. The production and the efficiency have been greatly improved with the simultaneous work of the arc sources. The present invention replaces the existing production in the laboratory with mass industrial production, which can automatically, continuously, and efficiently produce fullerene and metal fullerene.

DETAILED DESCRIPTION OF THE INVENTION

Figure 1:
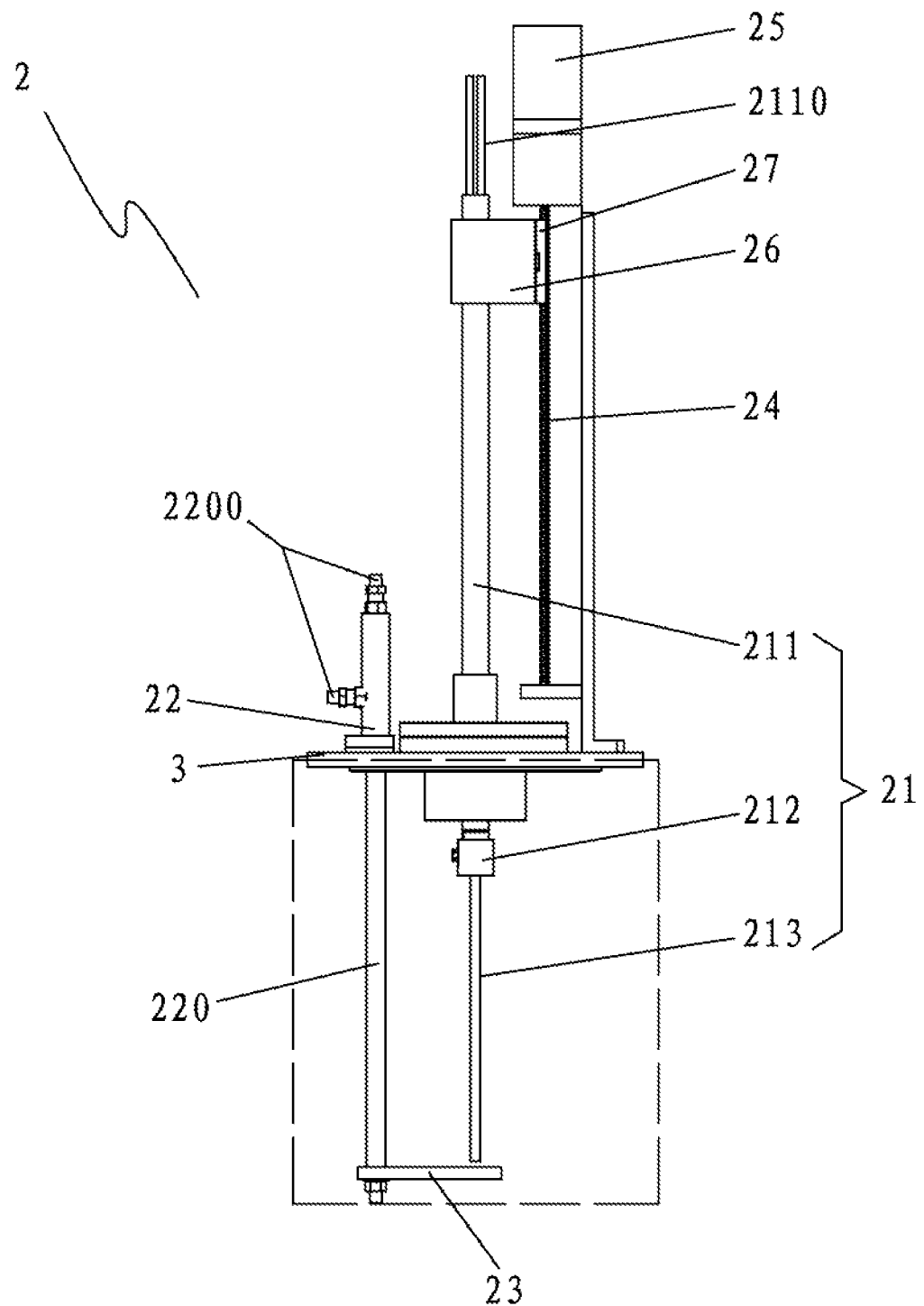
FIG. 1 is a schematic view of fullerene arc source of the present invention.

The present disclosure is described hereinafter with the accompanying drawings:

Embodiment 1: referring to FIG. 1, a fullerene arc source 2 comprises anode 21, cathode 22 and cathode trigger 23. Anode 21, cathode 22 and cathode trigger 23 form a closed current circuit. Cathode trigger 23 is arranged at one end of cathode 22. When a triggering end of anode 21 contacts with cathode trigger 23, an arc forms and the triggering end of anode 21 was evaporated to form a mixture comprising fullerene therein. The anode and the cathode are all located on the same side of the cathode trigger, to form a closed current circuit.

Figure 2:
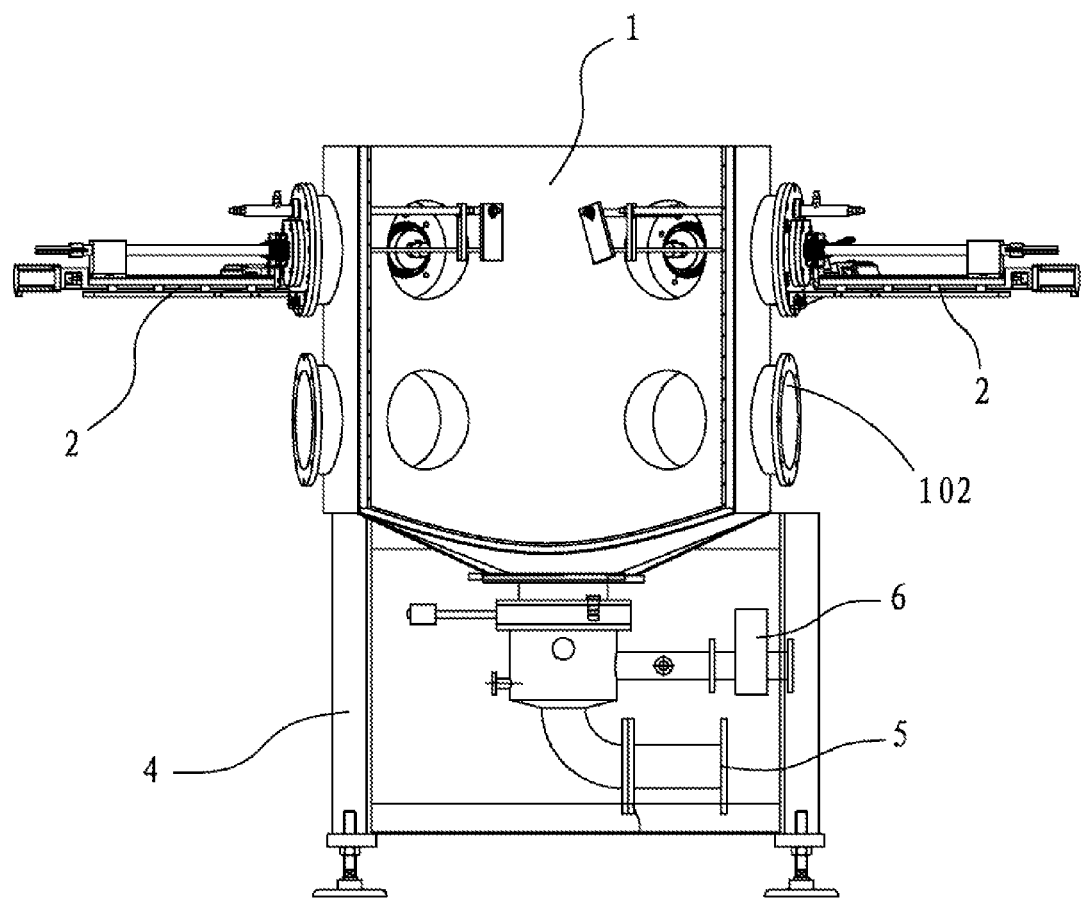
FIG. 2 is a schematic view of the fullerene manufacturing device using arc process.
Figure 3:
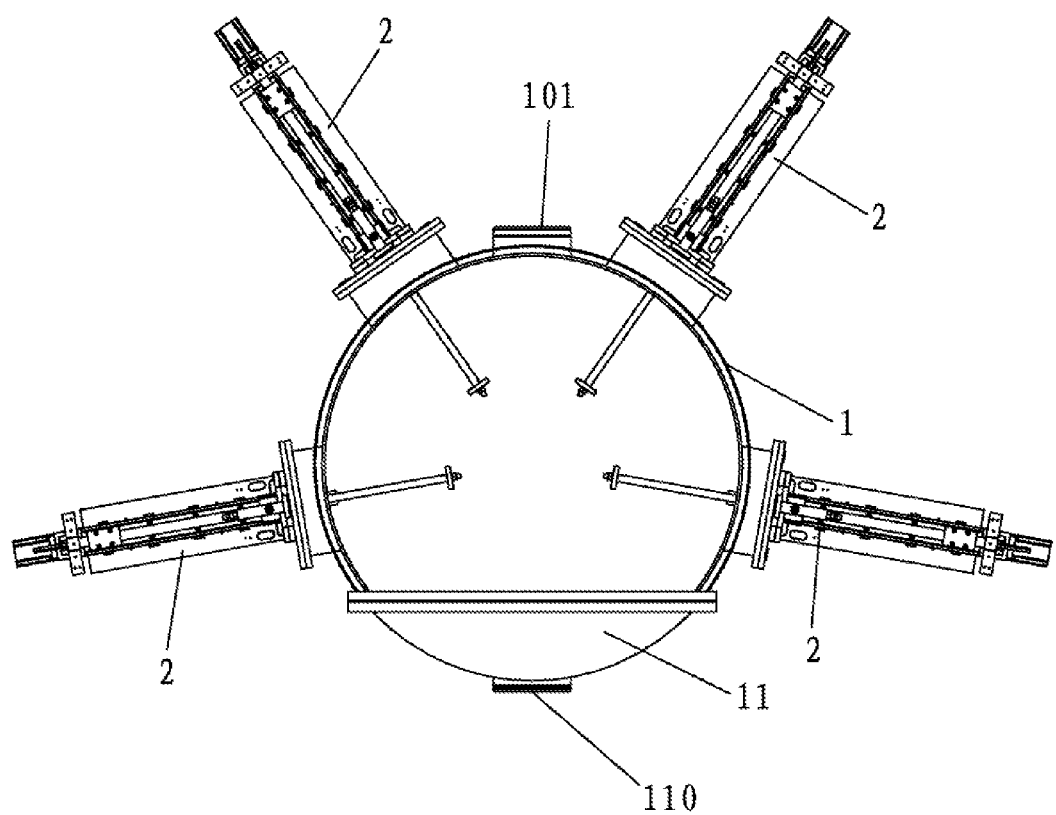
FIG. 3 is a top view of the fullerene manufacturing device using arc process.

Referring to FIGS. 1-3, cathode trigger 23 of fullerene arc source 2 is installed on one end of cathode 22. Cathode 22 and anode 21 are both installed on an installation component. The installation component can be furnace mounting plate 3, flange or other components fixed on vacuum furnace 1. The dotted box in FIG. 1 means that the components are installed on the vacuum furnace and located on the inner side, resulting the arc discharging occurs in a vacuum condition. The front end of anode 21 is a triggering end and is capable of moving forward and backward to maintain a relative position with cathode trigger 23. The triggering end of anode 21 is graphite rod 213 which is in connection with anode pushing shaft 211 to move forward and backward. Anode pushing shaft 211 passes through the installing component (i.e. furnace mounting plate 3 or flange) and is controlled by the linear sliding module 24. Linear sliding module 24 is located on the other side of the installing component relative to the triggering end. When installing the vacuum furnace, the linear sliding module 24 is located on the outside of the furnace. Linear sliding module 24 and servo motor 25 form an automatic pushing system to push the anode pushing shaft 211. Graphite rod 213 installed on anode 21 is then being pushed by the automatic pushing system. Anode pushing shaft 211 is fixed on sliding block 27 via anode insulating fixture 26, and connected with linear sliding module 24. A part of anode pushing shaft 211 located inside the furnace is installed with anode protective casing 212. A cooling passage is located inside anode pushing shaft 211 and cooling nozzle 2110 is located at the port of the cooling passage.

Referring to FIG. 1, cathode trigger 23 of fullerene arc source 2 can be graphite sheet, graphite rod or allotrope of graphite and is located on the front end of anode 21. In a preferred embodiment, cathode trigger 23 is perpendicular to graphite rod 213. Cathode trigger 23 is in connection with cathode shaft 220 which passes through furnace mounting plate 3 and extends outwardly to form an outside end of cathode. A cooling passage is located inside cathode shaft 220 and a cathode cooling nozzle 2200 is located at the port of the cooling passage.

Embodiment 2: referring to FIGS. 1-3, an efficient manufacturing device using an arc process comprises vacuum furnace 1, and at least one independent fullerene arc source 2 installed in vacuum furnace 1. Each arc source 2 generally comprises anode 21, cathode 22 and cathode trigger 23. Anode 21, cathode 22 and cathode trigger 23 form a closed current circuit. When anode 21 and cathode trigger 23 of each arc source contact with each other, a mixture comprising fullerene therein can be generated at the same time. A plurality of arc sources is installed on each layer of vacuum furnace 1 from top to bottom. Each layer generally comprises at least one arc source 2 and the arc source 2 are located around the vacuum furnace 1. FIG. 3 shows a layer with four arc sources. Each arc source is fixed on the corresponding interface of the vacuum furnace through furnace mounting plate 3 or flange. FIG. 2 shows an arc source device which comprises flange plates 102. The detailed structure of the device installing fullerene arc source 2 can be found in aforementioned embodiment 1. Anode 21 and cathode 22 of fullerene arc source 2 are both located on the same side of cathode trigger 23 (i.e. Cathode graphite sheet) and cathode trigger 23 is located on the top end of cathode shaft.

Referring to FIGS. 2&3, interface 101 for vacuumizing is located on vacuum furnace 1. Furnace door 11 of the vacuum furnace 1 comprises observation window 110 thereon. Referring to FIG. 2, vacuum furnace 1 is installed on base support 4. Bottom exits of the vacuum furnace is connected with automatic ash collecting tube 5. The exit of the collecting tube 5 is connected to the next manufacturing process which separates mixture of the ash. Magnetic valve 6 controlling switch is installed on automatic ash collecting tube 5. The ash is automatically pumped out or collected from the vacuum furnace by high-speed exhaust fan.

The present invention discloses an effective manufacturing facility that uses graphite arc process for producing fullerene. The effective manufacturing facility comprises vacuum furnace 1 and arc sources and so on. The effective manufacturing facility further comprises a plurality of flange plate installed on the vacuum furnace, automatic ash collecting device, vacuum system ports, vacuum gauge interface, cooling water port, furnace door and observation window of the furnace door. The vacuum furnace can be pumped into a vacuum through the interface of the vacuum system and the inner intensity of the pressure can be up to $1.0 \times 10^{-2}$ Pa.

Automatic ash collecting device is composed by automatic collecting tube and magnetic valve. Automatic collecting tube is connected to the manufacturing facilities used in the next process. When the magnetic valve is in open position, the exhaust fan automatically collects the ash inside the vacuum furnace.

The present invention discloses an arc source device comprising servo motor, linear sliding module, anode, cathode and cathode graphite sheet. The servo motor and the sliding module form an automatic pushing system. The pushing system pushes anode move forward and then pushes the graphite rod installed on the anode. The anode pushing shaft and the sliding module are fixed on the sliding block via the anode insulating fixture. Part of the anode pushing shaft located on the inner side of the furnace is installed with an anode protective casing. The anode protective casing insulated the high temperature generated by arc.

The arc source device is fixed on the vacuum furnace through a furnace mounting plate (or a flange). The dotted box in FIG. 1 means that the components are installed on the vacuum furnace and located on the inner side, resulting the arc discharging occurs in a vacuum condition. The anode, the graphite rod and the cathode graphite sheet form a closed circuit. When the graphite rod and the cathode graphite sheet contact with each other, an arc discharging phenomenon occurs. The arc discharging results into a rapid evaporation and consumption of the graphite rod. The evaporation and consumption process produce a mixture which contains fullerene. During the arc discharging process, the anode and the cathode are cooled by the cooling nozzle.

The working principle of the invention is conducted through the steps as following: installing graphite rod; pumping the vacuum furnace to a pre-set degree; filling the inner ambience with inert gases; connecting the arc source device with DC power source: generating arc through the discharging of the graphite rod and the cathode graphite sheet; the arc is maintained through the automatic pushing of the graphite rod. When the graphite rod is used up, the DC power source is shut down. The steps further comprising: opening the magnetic valve installed on the automatic ash collecting device; pumping out the ashes through the automatic collecting tube, the ashes contain mixture like graphite rod, amorphous carbon and fullerene therein generated by the arc discharging; separating the mixture in the subsequent process to obtain fullerene.

The amount of arc source device of the present invention can be varied depending on the needs and the size of the furnace. The production can be more than ten times greater than the existing technology in a single device.

While the foregoing written description of the invention enables one of ordinary skills to make and use what is considered presently to be the best mode thereof, those of ordinary skills will understand and appreciate the existence of variations, combinations; and equivalents of the specific embodiment, method and examples herein. The invention should therefore not be limited to the above described embodiments, but by all embodiments and methods within the scope and spirit of the invention.

The invention claimed is:

1. A fullerene arc source comprising:
an anode and a cathode;
wherein the anode comprises a triggering end and an anode pushing shaft, the cathode comprises a cathode shaft and a cathode trigger; wherein the anode, the cathode shaft and the cathode trigger form a closed current circuit;
wherein the cathode trigger is located at one end of the cathode shaft; the anode and the cathode shaft are both located on a same side of the cathode trigger; wherein the triggering end of the anode is perpendicular to the cathode trigger;
wherein when the triggering end contacts with the cathode trigger, an arc forms to evaporate the triggering end to obtain a mixture containing fullerene therein; and
wherein the fullerene arc source is in an ambience of inert gases.

2. The fullerene arc source of claim 1, wherein the anode and the cathode are fixed on a mounting component; and the triggering end is capable of moving forward and backward to maintain a relative position with the cathode trigger.

3. The fullerene arc source of claim 2, wherein the cathode trigger of the arc source is a graphite sheet or a graphite rod; and the mounting component fixing the anode and the cathode is selected from the group consisting of furnace mounting plate, and flange.

4. The fullerene arc source of claim 3, wherein the cathode trigger and a cathode shaft are connected with each other; and the cathode shaft passes through the mounting plate.

5. The fullerene arc source of claim 1, wherein the triggering end of anode is a graphite rod; the graphite rod is in straight connection with the anode pushing shaft to move forward or backward; the anode pushing shaft passes through a mounting component and is controlled by a linear sliding module; and the linear sliding module is located on an other side of the mounting component relative to the triggering end.

6. The fullerene arc source of claim 5, wherein a servo motor and the linear sliding module form an automatic pushing system; the pushing system pushes the anode move forward and then pushes the graphite rod installed on the anode; the anode pushing shaft is fixed on a sliding block via an anode insulating fixture and is connected to the linear sliding module; and part of the anode pushing shaft is located in an inner side of a furnace which is installed with an anode protective casing.

7. The fullerene arc source of claim 1, wherein the anode pushing shaft and the cathode shaft both have a cooling passage inside and a cooling nozzle is located at a port of the cooling passage.

8. A fullerene manufacturing device using an arc process, comprising:
a vacuum furnace and a fullerene arc source of claim 1;
wherein a plurality of independent fullerene arc sources are installed inside the vacuum furnace; the anode and the cathode of each arc source contact with each other and generate an arc; the triggering end of the anode is evaporated to form a mixture containing fullerene therein; and the plurality of arc sources installed inside the vacuum furnace work and discharge simultaneously to achieve a mass industrial production of fullerene; and
wherein the vacuum furnace is filled with inert gases.

9. The fullerene manufacturing device with arc source of claim 8, wherein the plurality of arc sources are installed on each layer of the vacuum furnace from top to bottom; each layer generally comprises at least one arc source and the arc source is located around the vacuum furnace; each arc source is fixed on a plurality of corresponding interface of the vacuum furnace through a mounting component; and the linear sliding module is located on an outside of the furnace.

10. The fullerene manufacturing device with arc source of claim 8, wherein the vacuum furnace comprises a plurality of vacuumed interfaces installed thereon; a furnace door of the vacuum furnace comprises an observation window; and the plurality of arc sources are fixed on a plurality of corresponding interfaces of the vacuum furnace through a furnace mounting plate or a flange.

11. The fullerene manufacturing device with arc source of claim 8, wherein a plurality of bottom exits of the vacuum furnace are connected with an automatic ash collecting tube; a plurality of exits of the automatic ash collecting tube are connected to a next manufacturing process; a magnetic valve controlling switch is installed on the automatic ash collecting tube; and the ash is automatically pumped out or collected from the vacuum furnace via a high-speed exhaust fan.

* * * * *